(12) United States Patent
Mahler et al.

(10) Patent No.: US 8,440,733 B2
(45) Date of Patent: May 14, 2013

(54) SEMICONDUCTOR COMPONENT AND PRODUCTION METHOD

(75) Inventors: Joachim Mahler, Regensburg (DE); Alfred Haimerl, Sinzing (DE); Michael Bauer, Nittendorf (DE); Angela Kessler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/461,202

(22) Filed: May 1, 2012

(65) Prior Publication Data

US 2012/0223424 A1 Sep. 6, 2012

Related U.S. Application Data

(62) Division of application No. 11/817,520, filed on Sep. 24, 2007, now Pat. No. 8,178,390.

(51) Int. Cl.
*C08J 9/00* (2006.01)

(52) U.S. Cl.
USPC ...... 521/77; 257/678; 257/794; 257/E21.502; 438/27; 438/106

(58) Field of Classification Search .................. 257/678, 257/794, E21.502; 438/27, 106; 521/77
See application file for complete search history.

(56) References Cited

U.S. PATENT DOCUMENTS

| | | | | |
|---|---|---|---|---|
| 5,122,858 | A * | 6/1992 | Mahulikar et al. | 257/753 |
| 5,776,990 | A * | 7/1998 | Hedrick et al. | 521/77 |
| 6,054,651 | A | 4/2000 | Fogel et al. | |
| 6,172,127 | B1 | 1/2001 | Choi et al. | |
| 6,509,386 | B1 | 1/2003 | Kohl | |
| 7,057,265 | B2 | 6/2006 | Takeda et al. | |
| 7,329,617 | B2 * | 2/2008 | Li et al. | 438/780 |
| 2002/0089069 | A1 | 7/2002 | Lamson et al. | |
| 2002/0130396 | A1 | 9/2002 | Hawker et al. | |
| 2002/0168872 | A1 * | 11/2002 | Farrar | 438/780 |
| 2004/0207096 | A1 | 10/2004 | Lamson et al. | |
| 2005/0006766 | A1 | 1/2005 | Nakayoshi et al. | |

FOREIGN PATENT DOCUMENTS

| | | |
|---|---|---|
| JP | 52041191 | 3/1977 |
| JP | 62185346 | 8/1987 |
| JP | 63080554 | 4/1988 |
| WO | 03096389 | 11/2003 |
| WO | 03107417 | 12/2003 |
| WO | 2004114374 | 12/2004 |
| WO | 2005071741 | 8/2005 |

OTHER PUBLICATIONS

Office Action mailed Jul. 7, 2010 in U.S. Appl. No. 11/817,520.
Office Action mailed Apr. 12, 2011 in U.S. Appl. No. 11/817,520.

* cited by examiner

*Primary Examiner* — David Vu
*Assistant Examiner* — Brandon Fox
(74) *Attorney, Agent, or Firm* — Dicke, Billig & Czaja, PLLC

(57) ABSTRACT

Semiconductor component and method for production of a semiconductor component. The invention relates to a semiconductor component having a semiconductor chip, which is arranged on a substrate, in one embodiment on a chip carrier, and an encapsulation material, which at least partially surrounds the semiconductor chip. The chip carrier is at least partly provided with a layer of polymer foam.

18 Claims, 3 Drawing Sheets

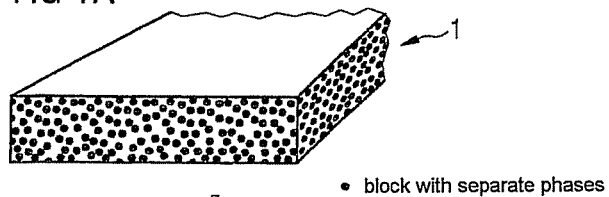
FIG 1A
- block with separate phases
- air/vacancy
FIG 1B
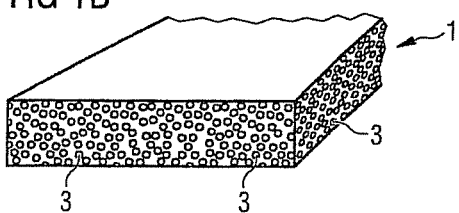
FIG 2
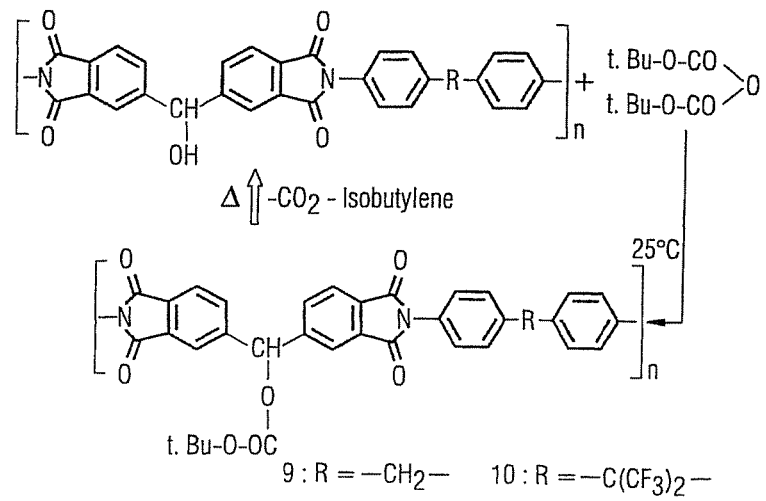

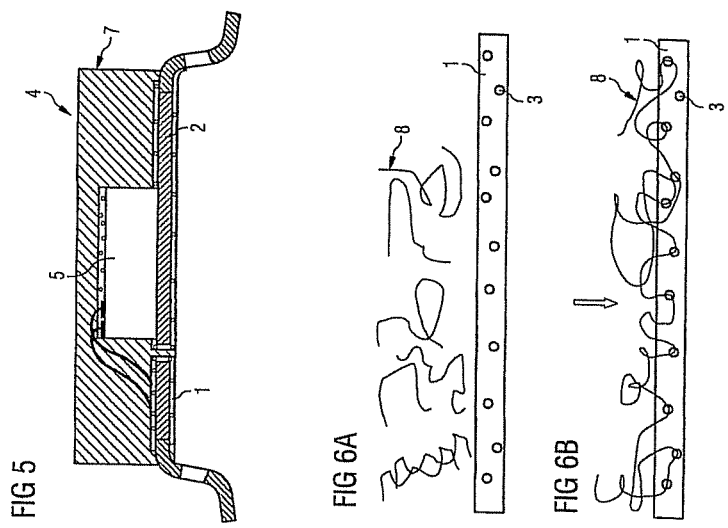

US 8,440,733 B2

SEMICONDUCTOR COMPONENT AND PRODUCTION METHOD

CROSS-REFERENCE TO RELATED APPLICATIONS

This Utility Patent Application is a divisional application of U.S. application Ser. No. 11/817,520, filed Sep. 24, 2007, and claims priority to German Application No. DE 10 2005 010 272.7, filed Mar. 3, 2005, and is also based on PCT/DE2006/000308, filed Feb. 20, 2006, all of which are herein incorporated by reference.

BACKGROUND

The present invention relates to a semiconductor component and to a method for production of a semiconductor component.

A semiconductor chip that is mounted on a chip carrier or a leadframe and is electrically connected or bonded thereto by using connecting wires, for example, is usually encapsulated in a molding compound in order to form a semiconductor housing. These semiconductor housings are normally produced from a plastic. Thermosetting plastics, in particular epoxy resin, are used particularly extensively for this purpose.

However, these encapsulating compounds have inadequate adhesion to the boundary interfaces or surfaces of the semiconductor chip or of the chip carrier which they enclose or adjoin. This leads to increased failure and fault risks for the semiconductor component, and not least to device qualifications not being passed.

In order to ensure sufficient adhesion in accordance with the requirements made of the semiconductor component and in accordance with the device qualifications, in the prior art a highly targeted and complicated selection and evaluation of suitable molding compounds was undertaken and the chip carrier, leadframe or substrate surfaces were treated by using complicated mechanical methods, such as roughening the surfaces to be connected, etc. Moreover, physico-chemical methods such as plasma-etching, electrolytic coating with adhesion-enhancing layers based on inorganic, metallic compounds were carried out in order to ensure sufficient adhesion.

However, the abovementioned mechanical or physico-chemical methods for achieving an enhancement of adhesion between the molding compound and a substrate give rise to very high process costs and the disadvantage of restricting the application to electrically conductive surfaces. Moreover, these methods also led only in part to the desired or required enhancement of the molding compound adhesion.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates two perspective sectional views through a layer composed of a block copolymer.

FIG. 2 illustrates a molecular representation of a polymer foam.

FIG. 5 illustrates a schematic sectional view through a semiconductor component with encapsulation.

FIG. 6 illustrates two schematic sectional views through the layer of polymer foam during the transfer molding process.

DETAILED DESCRIPTION

Figure 3:
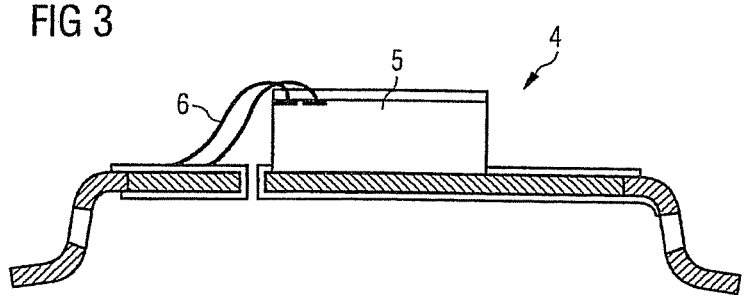
FIG. 3 illustrates a semiconductor component which has been at least partly coated with an organic substance.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method for production of a semiconductor component, and a corresponding semiconductor component, wherein sufficient adhesion between the molding compound from which the housing of the semiconductor component is produced and a substrate or metallic leadframe on which a semiconductor chip is arranged is achieved in a simple and therefore also cost-effective manner.

One embodiment provides a method for production of a semiconductor component, wherein the method includes:
  applying a solution of an organic substance to a substrate, in one embodiment to a chip carrier, wherein the organic substance has polymers and functional molecules which are suitable for reacting and crosslinking to form a layer of polymer foam;
  producing the polymer foam by applying heat to the organic substance, wherein the temperature is kept below 200° C.;
  crosslinking the polymer foam by applying heat to the polymer foam, wherein the temperature is kept above 200° C.;
  encapsulating a semiconductor chip arranged on the substrate with a plastic material.

Coating polymers have intrinsically surface-active groups or can be combined with a series of highly active groups such as silanes or isocyanates which ensure strong adhesion on the polymeric metallic or ceramic support. The disadvantage of such highly reactive polymer groups, however, is that, on account of their high reactivity they are then normally no longer available for a chemical reaction with the molding compound from which the housing surrounding the semiconductor chip is formed, whereby the binding of the encapsulating material has to be ensured in some other way. Therefore, before or after the die/wire bonding, the substrate or the chip carrier or the leadframe is coated with the solution of the organic substance, which has polymers and functional organic molecules which react and crosslink after application to form a polymer layer. The solution can be applied to the substrate by using a dipping, spraying, dripping or stencil printing method. During curing, the polymer coating leads to a splitting off of CO, $CO_2$ or other molecular segments that split off at relatively high temperatures from the polymer chain, whereby a solid polymer foam layer arises. It is also possible to use special block copolymers in which the foam arises as a result of the thermal decomposition of a thermolabile Co component, e.g., polypropylene oxide. The polymer foam layer has pores into which the still molten oligomer chains can diffuse during encapsulation with the epoxy resin molding compound, which entails not only the increased chemico-physical adhesion between the polymers (polymer foam and molding compound, e.g., epoxy resin) on account of the larger surface area and the pores of a foam but also a fixed mechanical anchoring of the molding compound. Furthermore, the polymer foam has the advantage that a very low dielectric loss occurs at high switching frequencies on account of the low dielectric constant ($\epsilon<3$) and the low loss factor tan $\delta$ ($<10^{-2}$) of the material, particularly if the foam is also used as "low-K dielectric" on the chip top side.

In accordance with a further embodiment, a process of producing an electrical connection between the chip carrier and the semiconductor chip arranged on the chip carrier is carried out prior to applying the solution to the chip carrier.

As an alternative to this, a process of producing the electrical connection between the chip carrier and the semiconductor chip arranged on the chip carrier can be carried out after applying the solution to the chip carrier.

The process of producing the electrical connection is carried out by using a die/wire bonding process.

By way of example, the organic substance used can be a polyimide or a high-performance thermoplastic.

As an alternative to this, the organic substance used can be a block copolymer in which the foam arises as a result of the thermal decomposition of a thermolabile Co component. This has the advantage that the pores of the foam can be produced particularly finely.

The thermolabile Co component is polypropylene oxide.

In a further exemplary embodiment of the invention, the layer of polymer foam is produced with pores of an order of magnitude which predominantly lies in the sub-μm range.

In one embodiment, a thermosetting plastic, in particular epoxy resin or a silicone resin, is used as plastic material for encapsulating the semiconductor chip.

In a further exemplary embodiment of the invention, the encapsulating is carried out with an epoxy resin molding compound by using a transfer molding process.

Furthermore, the invention provides a semiconductor component having a semiconductor chip, which is arranged on a substrate, in particular on a chip carrier, and a housing, which at least partially surrounds the semiconductor chip, wherein the chip carrier is at least partly provided with a layer of polymer foam. By using the layer of polymer foam provided on the chip carrier, leadframe or substrate, particularly good adhesion in the manner described above to the encapsulating compound composed of plastic material, in particular composed of a thermosetting plastic, is obtained in simple and cost-effective manner, whereby fault risks of the semiconductor component are minimized and the quality of the semiconductor component is thus improved, also with regard to specific device qualifications.

In one embodiment, the layer of polymer foam is provided on the chip carrier at the boundary surfaces with respect to the housing, with the result that it is possible to ensure sufficient adhesion of the housing to the chip carrier.

In accordance with one embodiment of the invention, the substrate or the chip carrier is produced from metal.

As an alternative to this, the substrate or the chip carrier can be produced from ceramic or polymer or a plastic substrate. The enhancement of the molding compound adhesion by applying a layer of polymer foam can be obtained at all surfaces i.e. at surfaces of any materials.

In one embodiment, the layer of polymer foam has a dielectric constant of $\epsilon<3$, in particular $<1.5$. Very low energy losses are thus obtained at high switching frequencies on account of the low dielectric constant and the low loss factor tan $\delta$ ($<10^{-2}$) of the material.

In accordance with one embodiment of the invention, the layer of polymer foam is produced from polyimide or a high-performance thermoplastic.

In one embodiment, the layer of polymer foam is produced from a block copolymer in which the foam arises as a result of the thermal decomposition of a thermolabile Co component.

Furthermore in one embodiment, the thermolabile CO component is polypropylene oxide.

In one embodiment, it is furthermore advantageous if the layer of polymer foam has pores of an order of magnitude which predominantly lies in the sub-um range. The still molten oligomer chains diffuse into the pores during the encapsulation with the epoxy resin molding compound, which entails not only the increased chemico-physical adhesion between the two polymers (polymer foam and molding compound) on account of the larger surface area and the pores of a foam but also a fixed mechanical anchoring of the molding compound.

In accordance with a further embodiment of the invention, the housing is produced from a plastic material.

In this case, the plastic material is a thermosetting plastic, in particular epoxy resin.

In one embodiment, it is furthermore advantageous if the housing is produced by using a transfer molding process.

The layer of polymer foam has a thickness within a range of between 2 nm-10 μm depending on the polymeric system, the concentration of the starting solution and the processing conditions such as coating technique, temperature, solvent type, coating rate, etc. FIG. 1 perspectively illustrates two sectional views through a layer 1 composed of a block copolymer. FIG. 1a) illustrates an illustration of the layer 1, such as can be applied to a substrate 2 (not illustrated), before a thermal treatment for forming a foam has been carried out. The layer 1 still has separate phases here, the black filled circles representing a thermolabile Co component which decomposes under the action of temperature and thus forms the pores 3 in the layer 1, as illustrated in FIG. 1b), the open circles illustrated in the layer 1 here representing vacancies or air in the material.

FIG. 2 illustrates a molecular representation of a polymer foam such as has been described with regard to FIG. 1 and such as can be used for the production of the semiconductor component 4 (not illustrated) according to the invention. Here, $(t.Bu-O-CO)_2O$ has been incorporated as thermally labile group into the main polymer chain, which decomposes below $T_g$ of the polymer and thus leads to the formation of the pores in the nm size range.

FIG. 3 illustrates a semiconductor component 4, which has been at least partly coated with an organic substance from which the layer 1 of polymer foam is formed in two further method processes. In this example, the layer 1 has been applied on the surface of the semiconductor chip 5 and the upper and lower surface of the substrate 2 or chip carrier. Here, too, the semiconductor chip 5 has already been electrically connected to the substrate 2 by using conducting wires 6.

Figure 4:
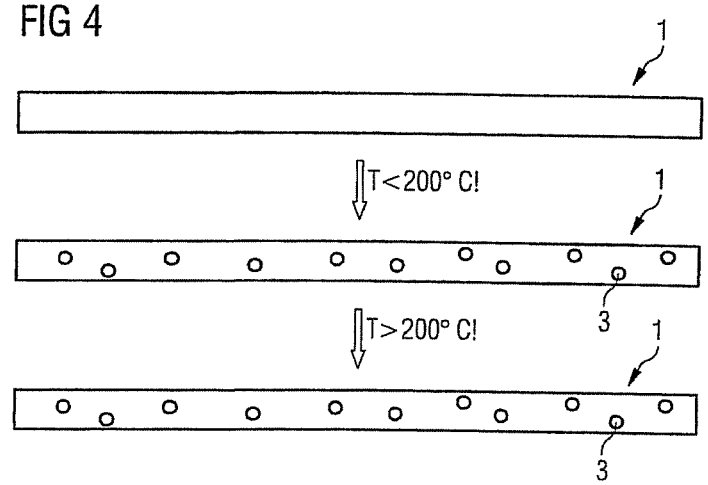
FIG. 4 schematically illustrates the formation of the layer of polymer foam in two method processes.

FIG. 4 schematically illustrates the formation of the layer 1 of polymer foam in the two method processes that follow the method process illustrated in FIG. 3. As viewed from top to bottom, this figure illustrates the layer 1 composed of an organic substance, which has polymers and functional organic molecules which react and crosslink after application to form a polymer layer, as a continuous black bar, which reflects the state of the coating illustrated in FIG. 3. Under the action of heat, wherein the temperature is kept below 200° C., during the curing of the layer 1, a splitting off for example of CO, $CO_2$ and other molecular segments or thermolabile groups that split off at relatively high temperatures occurs. These drive out from the material and leave behind pores 3 in the form of voids in the predominantly sub-μm size range. In a further method process, which is carried out under the action of temperatures above 200° C., the polymer foam thus formed then crosslinks to form a solid composition or layer 1 having extremely fine pores 3 or voids.

FIG. 5 illustrates a schematic sectional view through a semiconductor component 4 with an encapsulation or a housing 7 surrounding the semiconductor chip 5 arranged on a substrate 2 or chip carrier. The interfaces of the substrate 2 and of the semiconductor chip 5 with respect to the housing 7 are coated with a layer 1 of polymer foam, thereby ensuring a very good adhesion of the molding compound of the housing 7 composed of epoxy resin thereon.

Finally, FIG. 6 illustrates two schematic sectional views through the layer 1 of polymer foam during the transfer molding process for forming the housing 7 composed of epoxy resin. In FIG. 6a) which illustrates the beginning of the transfer molding process, the molding compound having epoxide chains 8 is applied to the surface of the layer 1 of polymer foam which has the pores 3. During the progress of the transfer molding process, i.e. here also during the process of encapsulating the semiconductor component 4 (not illustrated) with the epoxy resin molding compound, the oligomer chains or epoxide chains 8 can diffuse into the pores 3 in the layer 1 of polymer foam, as illustrated in FIG. 6b). This obtains, as already mentioned, not only the increased physical adhesion between the polymer foam and the molding compound on account of the larger surface area and the pores of a foam, but also a fixed mechanical anchoring of the molding compound.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
a substrate at least partly provided with a layer of polymer foam;
a semiconductor chip arranged on the substrate; and
a housing which at least partially surrounds the semiconductor chip and covers at least portions of the substrate, wherein the layer of polymer foam is disposed on the substrate at boundary surfaces between the substrate and the housing, and wherein material of the housing is disposed within pores in the polymer form to anchor the housing thereto.

2. The semiconductor component of claim 1, comprising wherein the chip carrier is produced from metal.

3. The semiconductor component of claim 1, comprising wherein the chip carrier is produced from ceramic or polymer.

4. The semiconductor component of claim 1, comprising wherein the layer of polymer foam has a dielectric constant of $\epsilon<1.5$.

5. The semiconductor component of claim 1, comprising wherein the layer of polymer foam is produced from polyimide or a high-performance thermoplastic.

6. The semiconductor component of claim 1, comprising wherein the layer of polymer foam is produced from a block copolymer in which the foam arises as a result of the thermal decomposition of a thermolabile Co component.

7. The semiconductor component of claim 6, comprising wherein the thermolabile Co component is polypropylene oxide.

8. The semiconductor component of claim 1, comprising wherein the layer of polymer foam has pores of an order of magnitude which predominantly lies in the sub-μm range.

9. The semiconductor component of claim 1, comprising wherein the housing is produced from a plastic material.

10. The semiconductor component of claim 8, comprising wherein the plastic material is a thermosetting plastic.

11. The semiconductor component of claim 1, comprising where the housing is produced by a transfer molding process.

12. The semiconductor component of claim 1, comprising where the layer of polymer foam has a thickness within a range of between 2 nm - 10 μm.

13. A semiconductor comprising:
a semiconductor chip having a first major surface and an opposing second major surface;
a carrier, the first major surface of the semiconductor chip mounted on the carrier;
a polymer foam layer disposed on the second major surface of the semiconductor chip and on at least portions of the carrier not covered by the semiconductor chip; and
an encapsulation material encapsulating the semiconductor chip and covering at least portions of the carrier, wherein the encapsulation material is disposed within pores in the polymer foam layer to anchor the encapsulation material thereto.

14. The semiconductor of claim 13, comprising:
wherein the polymer foam is a crosslinked polymer foam.

15. The semiconductor of claim 13, wherein the layer of polymer foam includes pores of an order of magnitude which predominantly lies in the sub-μm range.

16. The semiconductor of claim 13, wherein a thermosetting plastic encapsulates the semiconductor chip.

17. The semiconductor of claim 16, wherein the encapsulating material is an epoxy resin molding compound.

18. The semiconductor of claim 16, wherein the semiconductor chip is electrically connected to the carrier with one or more wires, and wherein connection points of the wires to the carrier are covered by the polymer foam layer.

* * * * *